United States Patent [19]

Moore et al.

[11] 4,009,451
[45] Feb. 22, 1977

[54] FREQUENCY RANGE SELECTABLE OSCILLATOR FOR MULTICHANNEL COMMUNICATION SYSTEM

[75] Inventors: Edward B. Moore, North Caldwell; Donald P. Ryan, Pine Brook, both of N.J.

[73] Assignee: Edo-Aire, a Division of Edo Corporation, Fairfield, N.J.

[22] Filed: June 12, 1975

[21] Appl. No.: 586,227

[52] U.S. Cl. .............................. 331/64; 116/124.3; 325/20; 325/25; 325/455; 331/18; 331/36 C; 331/116 R; 331/177 R; 331/177 V; 334/55; 334/87

[51] Int. Cl.² .................... H03B 5/36; H03J 1/02

[58] Field of Search .......... 331/18, 34, 36 C, 36 R, 331/64, 116 R, 158, 159, 177 R, 177 V, 179; 334/86, 87, 55; 325/17, 20, 25, 453, 455; 116/124.1 R, 124.3

[56] References Cited

UNITED STATES PATENTS

| | | | |
|---|---|---|---|
| 1,958,282 | 5/1934 | Tregenza | 116/124.3 |
| 3,103,631 | 9/1963 | Ito et al. | 325/453 X |
| 3,641,461 | 2/1972 | Mrozek | 331/116 R |
| 3,778,998 | 12/1973 | Berney | 331/179 X |

Primary Examiner—Siegfried H. Grimm
Attorney, Agent, or Firm—Richards, Harris & Medlock

[57] ABSTRACT

To provide the required multiple channels for an aircraft communications system, a crystal controlled reference oscillator includes a tunable circuit for changing the base reference frequency provided by a crystal. The base reference frequency of the crystal controlled reference oscillator is pulled in frequency by changing the capacitance shunting the crystal. Two transistor switches change appropriate capacitors in series with the usual oscillator capacitor to obtain the capacitance values needed to pull the base reference frequency and thereby provide additional reference frequencies. The transistor switches are controlled by pilot actuated controls that operate a sliding display mark over a digital frequency indicator.

5 Claims, 10 Drawing Figures

FREQUENCY RANGE SELECTABLE OSCILLATOR FOR MULTICHANNEL COMMUNICATION SYSTEM

This invention relates to a multichannel communications system, and more particularly to a tunable reference oscillator as part of the frequency synthesizer to provide increased frequency channels.

Heretofore, the frequency range of 118.000 MHz to 135.975 MHz, as used in aircraft communications, was divided into 50 KHz steps to provide 360 possible channels of communication. In order to provide additional channels to increase the efficiency of aircraft communications, the U.S. government, Department of Transportation, Federal Aviation Administration, has announced an intention to allocate channels on increments of 25 KHz thereby providing 720 transmit and receive channels over the frequency range now in use. The transmit and receive channels are on the same frequency (single channel simplex).

The need for many narrow single channels in the broad tuning range of aircraft communication imposes serious restrictions on the allowable variations and drift of a local oscillator. Conventional analog type tuning, with ganged tuning condensers, cannot be calibrated with sufficient precision to accurately obtain the resolution desired. Further, tuning dials to achieve such resolution are difficult to construct and would be most difficult and time consuming for an operator to use during flight. Thus, there are two basic problems to be solved in providing 720 transmit and receive channels over the allocated frequency range for aircraft communication. One of these problems relates to the electrical circuit to provide the additional channels and the second problem is to provide a simple, and not cluttered, method of displaying the channels selected.

Several schemes are being used in all price ranges of equipment to obtain the 720 channels with 25 KHz increments over the tuning range. Most have some disadvantage as compared to the standard 360 channels, 50 KHz increment arrangement. The standard 360 channels, 50 KHz increment arrangement usually included two tuning dials either separately or concentrically mounted. One of the tuning dials selects a frequency in MHz increments and the second dial selects fractions MHz increments. With such an arrangement, there are 18 positions on the MHz tuning dial and 20 positions on the fractional MHz tuning dial. To provide 720 channels in the broad tuning range, one commonly used adjustment causes the fractional MHz tuning dial to be turned through 40 positions to accomplish a 1 MHz change instead of the previous 20 positions for 360 channel selections. This makes reading the tuning dial difficult and causes an extra workload for the pilot or other crew member of the aircraft.

Another arrangement uses three knobs to select the 360 channels in 50 KHz increments or the 720 channels in 25 KHz increments. One of the three tuning dials switches in MHz increments, a second of the dials controls the frequency selection in increments of tenths of MHz, and the third tuning dial controls the frequency selection in 0.025 MHz increments. Again, additional steps are required by the pilot with this arrangement as compared to the workload for a 360 channel communication system.

A feature of the present invention is to provide a multichannel communications system that minimizes the workload for the pilot or other crew member of an aircraft. In accordance with the present invention, the standard two tuning dial arrangement is utilized to select 720 channels at 25 KHz increments. Thus, an additional advantage of the present invention is to provide a multichannel communications system utilizing proven and reliable mechanical mechanisms offering less probability of gear or other drive mechanism failures, such as Geneva movements.

To provide the additional channels, a communications system in accordance with the present invention utilizes a tunable crystal controlled oscillator as a part of a frequency synthesizer with decimal dividers for providing the operating frequencies to the transmitter and receiver sections. The tunable crystal controlled oscillator is pulled in frequency by operation of panel mounted toggle switches that eliminate the requirement of accurate positioning or adjustment on the part of a pilot or other crew member. Using the tunable crystal controlled oscillator provides the advantage of ready adaptability to present 360 channel designs.

In addition to the tunable crystal controlled oscillator, a communications system in accordance with the present invention utilizes a standard 18 position display drum for indicating a selected frequency in MHz increments. A fractional MHz indicator is mounted juxtaposition the MHz increment indicator and has a three digit display. A mask moves to interchangeably cover the last two digits when the system of the present invention is switched between one of two 360 channels of operation thereby providing a selection from 720 channels. For 720 channel operation, a switch that pulls the crystal controlled oscillator frequency also actuates the mask to cover the middle digit of the fractional MHz indicator and uncovers the least significant place digit.

In accordance with the present invention, a tunable reference oscillator includes a crystal selected to oscillate at a desired base reference frequency with a capacitor connected to the crystal in an oscillating circuit. The value of the capacitance connected to the crystal is changed to pull the oscillations of the crystal from one base reference frequency to an alternate base reference frequency. Connected to the oscillator circuit is an amplifier that generates a reference output frequency, typically to a digital frequency synthesizer in a communications system.

Further in accordance with the present invention, a multichannel communications system includes tuning dials for selecting an operating frequency coupled to a digital display of the selected frequency and has a frequency generator also coupled to the tuning dials to provide an operating frequency at an output terminal. The frequency generator includes a reference oscillator having a crystal selected to oscillate at a desired base reference frequency when connected in a comparator circuit. The capacitance is changed to pull the oscillations of the crystal from one base reference frequency up to an alternate base reference frequency. An amplifier is connected to the crystal-capacitor circuit and generates the reference output frequency of the generator. A mask coupled to the means for changing the capacitance modifies the digital display to indicate different frequency ranges.

A more complete understanding of the invention and its advantages will be apparent from the specification and claims and from the accompanying drawings illustrative of the invention.

Referring to the drawings.

Figure 1:
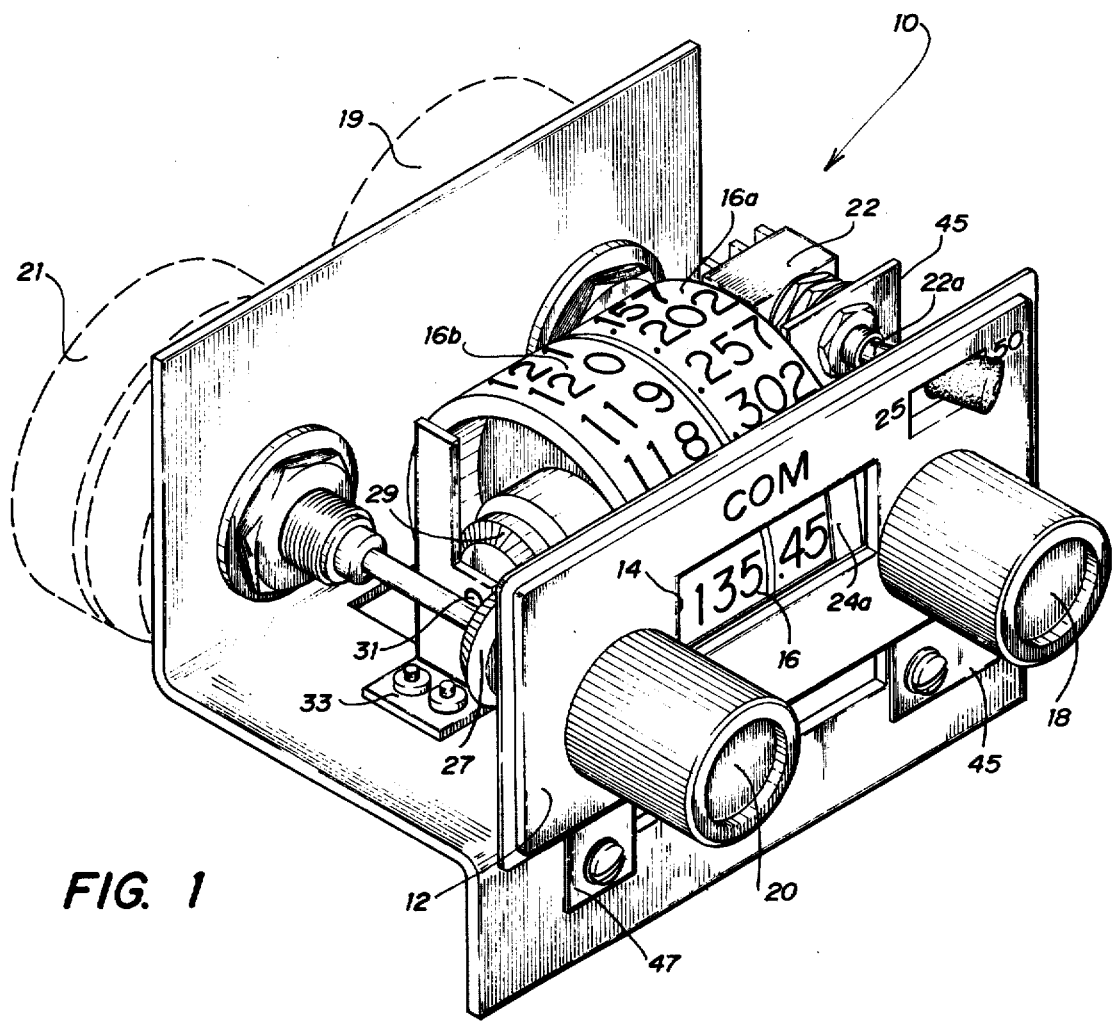
FIG. 1 is a pictorial view of a channel selector for an aircraft communications system for operation in one of two 360 channels for a total selectability of 720 channels in the frequency range of 118.000 MHz to 135.975 MHz.

Referring to FIG. 1, there is shown a pictorial of a channel selector for an airborne communications system including a transmitter and receiver that transmits and receives on the same frequency and operates in the 118.000 MHz to 135.975 MHz frequency band, with 25 KHz spacing between 720 selectable frequencies. The selector is mounted to a frame 10 that includes a front panel 12 having a bezel 14 for displaying in a digital format one of the 720 selectable frequencies.

The front panel 12 contains all of the controls and displays required to operate the communications system of the present invention. Toward the right side of the panel, from a display 16, is a fractional MHz frequency selector dial 18 mounted to the shaft of a selector switch 19 for control of electronic circuitry and setting of the fractional MHz frequency portion of the display 16. Toward the left of the display 16 is a MHz frequency selector dial 20 that is mounted on a shaft of a selector switch 21 for control of electronic circuitry and setting the MHz frequency digits of the display 16. An operator selects the desired frequency with the frequency selector dials 18 and 20.

Extending through the front panel 12, above the selector dial 18, is a toggle switch 22 that operates to change the systems from one 360 channel band having 50 KHz intervals to a second 360 channel band to thereby provide 720 selectable frequencies of 25 KHz intervals. Mechanically coupled to the toggle switch 22 is a mask 24 that alternately blocks out one of the two least significant digits of the display 16.

Figure 2:
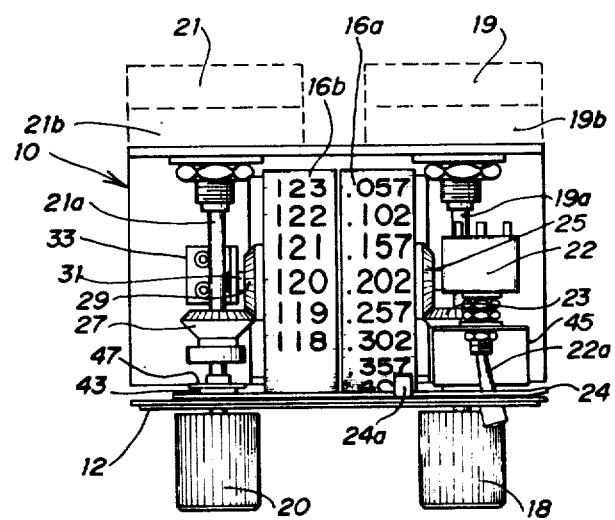
FIG. 2 is a top view of a slidable mask display indicating a selected frequency.

Referring to FIG. 2, there is shown a top view of the channel selector where the selector dial 18 is fastened to a shaft 19a of the selector switch 19. Also attached to the shaft 19a is a bevel gear 23 engaging a bevel gear 25 formed as an integral part of a fractional MHz frequency indicator drum 16a as part of the display 16. Included as part of the selector switch 19 is a detent positioner 19b to establish fixed selected positions of the drum 16a for rotation of the selector dial 18.

Similarly, the selector dial 20 is mounted on a shaft 21a extending from the selector switch 21. Also mounted to the shaft 21a is a bevel gear 27 engaging a bevel gear 29 formed as an integral part of an MHz frequency indicator drum 16b as part of the display 16. The drum 16b has selected fixed positions as determined by a detent positioner 21b as part of the selector switch 21.

The drums 16a and 16b rotate on a shaft 31 that is supported by brackets 33 (only one shown) affixed to the frame 10. Thus, by rotating the selector dials 18 and 20 a selected frequency from 118.000 MHz to 135.975 MHz is displayed to an operator by the display 16.

Figure 3:
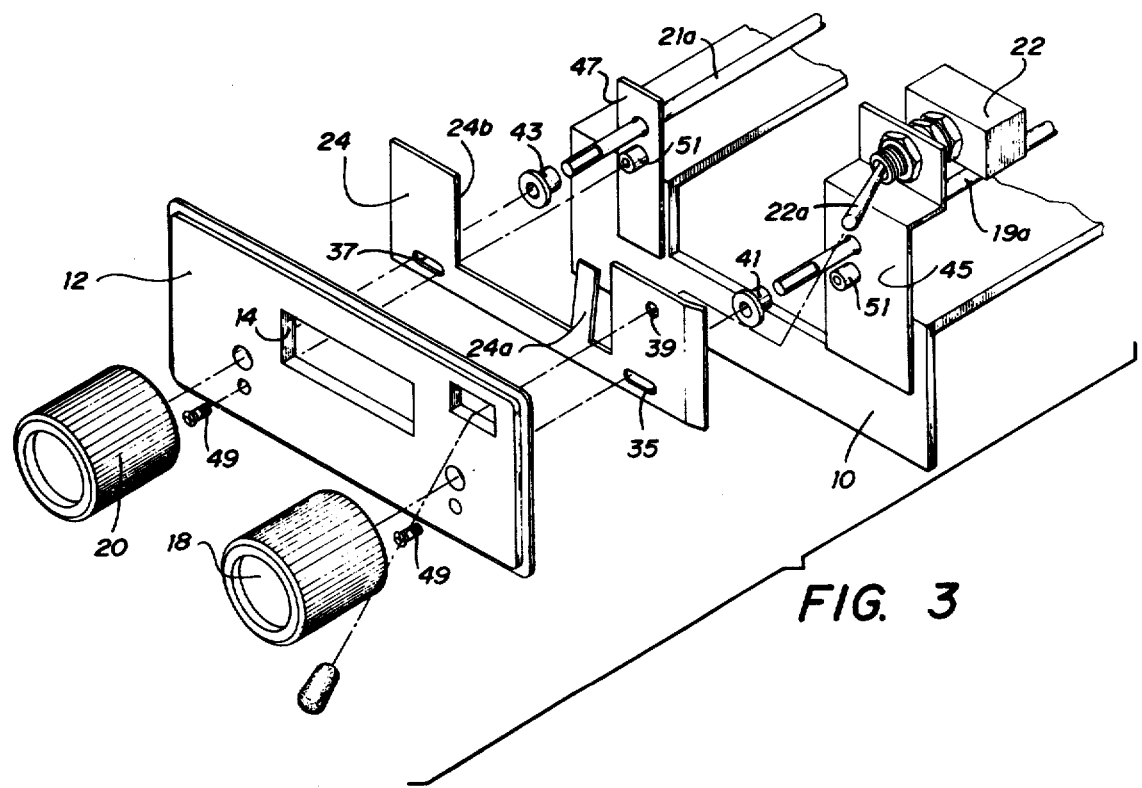
FIG. 3 is an exploded view of the sliding mask assembly of FIG. 2.

Referring to FIG. 3, operating the toggle switch 22 changes the communications system of the present invention from one 360 frequency channel to a second 360 frequency channel at 50 KHz intervals thereby providing 720 selectable frequencies at 25 KHz intervals. In addition, operating the toggle switch 22 changes the display 16 by movement of the mask 24 mounted immediately to the rear of the front panel 12. The mask 24 is basically rectangular in configuration with a cutout portion 24b for viewing the display 16. Projecting into this cutout portion 24b is a mask finger 24a that extends across the bezel 14 when in the assembled position. When assembled, the mask 24 is slidably positioned on the shafts 19a and 21a by means of elongated slots 35 and 37, respectively. The shafts 19a and 21a thus position the mask 24 with respect to the toggle switch 22 that includes a toggle arm 22a extending through an aperture 39 of the mask 24. Movement of the toggle arm 22a causes the mask 24 to slide between two extreme positions as determined by detents in the toggle switch 22.

The mask 24 is located immediately behind the front panel 12 by means of spacers 41 and 43 assembled on the shafts 19a and 21a, respectively. With the spacers 41 and 43 and the mask 24 positioned on the shafts 19a and 21a, the front panel 12 is fastened to brackets 45 and 47 by means of face plate screws 49. The screws 49 are threaded into stubs 51 extending from the brackets 45 and 47 that are welded or otherwise secured to the frame 10. Also mounted to the bracket 45 is the toggle switch 22.

Figure 4A:
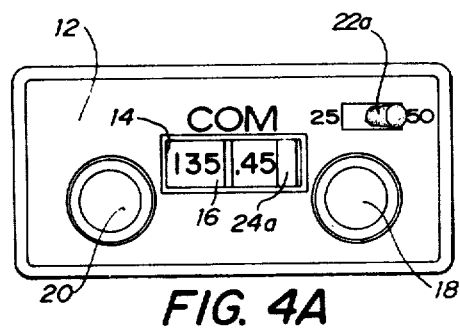
FIGS. 4A and 4B are front views of the channel selector with the sliding mask in the two selectable positions.
Figure 4B:
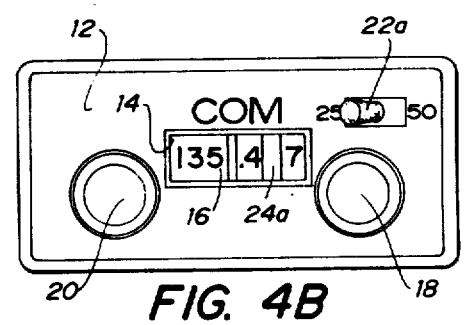

Referring to FIGS. 4A and 4B, with the channel selector assembled as shown in FIG. 1, the mask finger 24a is positionable to either cover the far right digit in the display 16 or the second digit to the far right position. As illustrated in FIG. 4A, with the toggle switch 22 in the 50 position the mask finger 24a covers the far right digit position of the display drum 16a, thereby presenting a five digit display including two digits immediately to the right of the decimal point. Changing the toggle switch 22 to the 25 position, as shown in FIG. 4B, slides the mask 24 such that the mask finger 24a covers the middle digit of the display drum 16a. The display 16 now indicates five digits with the two digits to the right of the decimal point separated by the mask 24a. In addition to changing the position of the mask finger 24a, operation of the toggle switch 22 also modifies the transmit and receive frequencies of the communication system as will now be explained.

Figure 5:
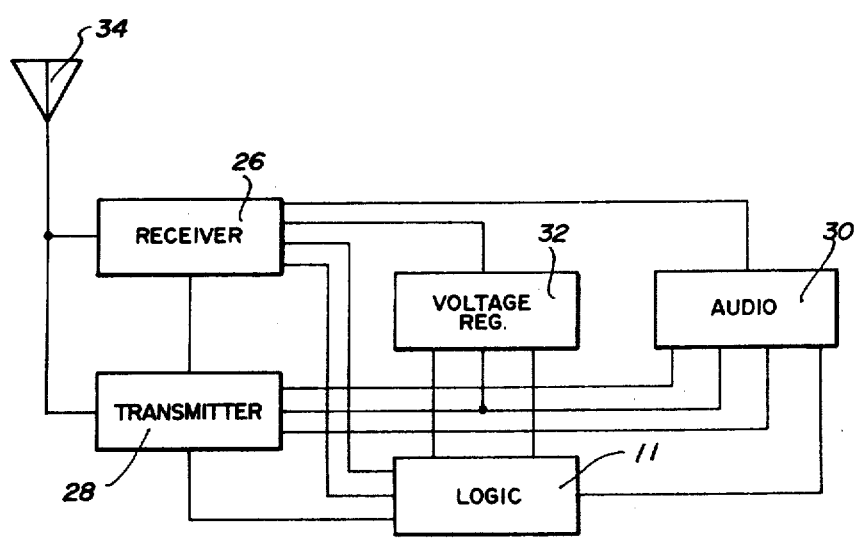
FIG. 5 is a block diagram of an aircraft communications transceiver.

Referring to FIG. 5, there is shown a block diagram of a communications system including a frequency synthesizer logic network 11 that provides precise, selectable, frequency outputs from 118.000 MHz to 135.975 MHz in either 25 KHz increments or 50 KHz increments, depending on the position of the toggle switch 22. The precise frequencies are generated by a voltage controlled oscillator and are selectable by an operator through the selector dials 18 and 20 on the front panel 12. The oscillator output frequencies are supplied to a VHF receiver 26 and a VHF transmitter 28. These frequencies are respectively referred hereinafter as the "receiver injection" and "transmitter excitation" frequencies.

Other identifiable sections of the communications system of FIG. 5 include an audio amplifier 30, for generating headphone and speaker audio, transmitter audio modulation, and a power supply 32 for internally required regulated voltages for the system. The receiver 26 and the transmitter 28 have a common connection to a transmit/receive antenna 34.

Figure 6:
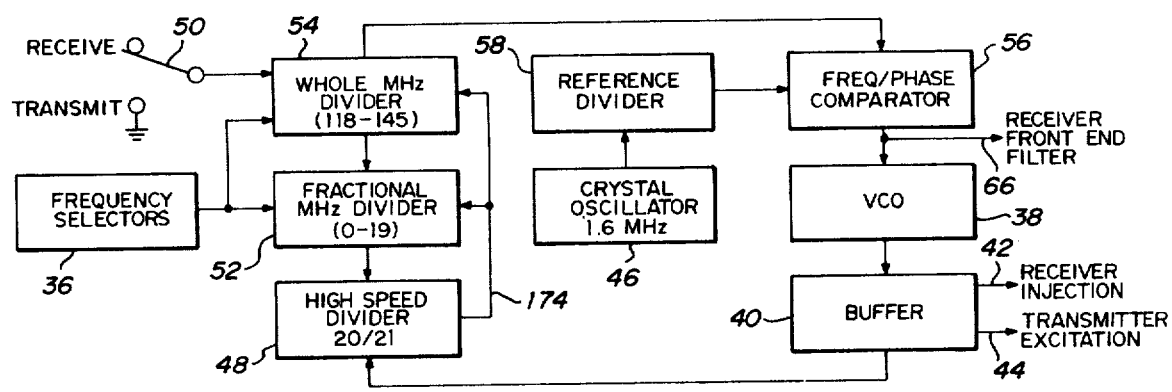
FIG. 6 is a block diagram of a digital frequency synthesizer with decimal dividers for providing a receiver injection frequency and a transmitter excitation frequency to the transceiver of FIG. 5.

Referring to FIG. 6, there is shown a block diagram of the frequency synthesizer logic network 11 wherein the selector dials 18 and 20 are represented by a block 36. The voltage controlled oscillator (VCO) output frequencies are supplied to the receiver and transmitter sections 26 and 28 through a common buffer amplifier 40 with the receiver injection frequency generated on a line 42 and the transmitter excitation frequency generated on the line 44.

The VCO 38 is precisely controlled by a phase lock loop which controls phase and frequency through a comparator 56 having an input from a precision crystal reference oscillator 46 through a reference divider 58.

The buffer 40 drives a high speed divide circuit 48 which divides the VCO output frequency by a factor of 20 when the selected frequency is a whole number and alternately divides the VCO frequency by a factor of 20 or 21 when the selected frequency includes a fractional value from 0.05 MHz to 0.95 MHz.

Assume that a frequency of 118.000 MHz is selected and the synthesizer is in the transmit mode, by operation of the transmit/receive switch 50, a fractional MHz divide circuit 52 is inhibited from counting and the high speed divider 48 is set in a divide-by-20 mode. A whole MHz divider 54 is preloaded by the frequency selector switch (controlled by the selector dial 20) with a complement number which enables the whole MHz divider 54 to divide the output of the high speed divider 48 by a factor of 118 with the result that the output of the divider 54 is 50 KHz. Thus, taking the total divide number of 20, in the high speed divider 48, and 118 in the whole MHz divider 54, a transmitter excitation of 118.000 MHz is obtained.

If a frequency of 118.050 is selected, the fractional MHz divider 52 is preloaded by selector switches coupled to the selector dial 18 and the high speed divider is in a divide-by-21 mode for one clock pulse. After one clock pulse, the high speed divider 48 is programmed to a divide-by-20 mode for the remainder of the count, thereby yielding an output frequency of 118.050 MHz on the line 44.

Connected to the whole MHz divider 54 is the frequency/phase comparator 56 that converts two input frequency signals, one being a reference frequency from the reference divider 58 and one being a variable from the divider 54, into a DC level which is proportional to a value necessary to generate the selected output frequency from the voltage controlled oscillator 38. The reference divider 58 is coupled to the output of the crystal oscillator 46 to generate the reference signal to the phase comparator 56.

Figure 7:
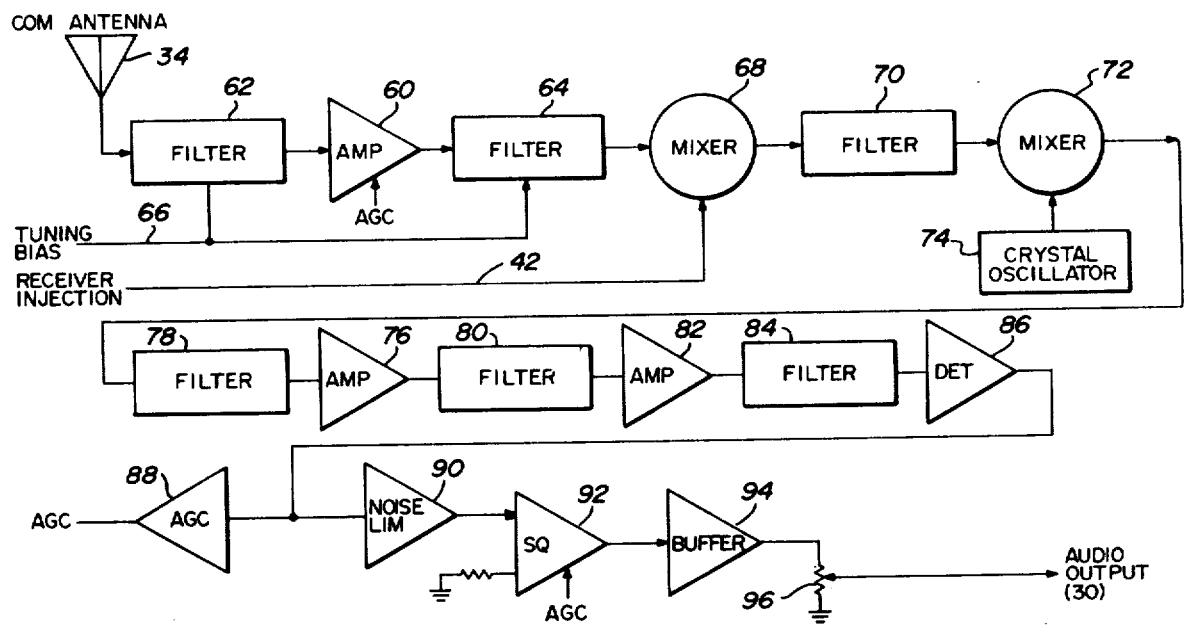
FIG. 7 is a block diagram of the receiver section of FIG. 5 operating at a frequency from the synthesizer of FIG. 6.

Referring to FIG. 7, there is shown a block diagram of a receiver 26 having a front end consisting of an automatic gain control RF amplifier 60 with a double tuned filter 62 connected to the input terminal and a double tuned filter 64 connected to the output terminal. The filters 62 and 64 receive a tuning bias voltage on a line 66 from the output of the comparator 56. Coupled to the input of the filter 62 is the antenna 34. Connected to the output of the filter 64 is a mixer amplifier 68 that also receives the receiver injection frequency from the buffer 40 of the frequency synthesizer 11 over a line 42. The mixer 68 is followed by a bandpass filter 70 which provides first IF selectivity rejecting the image frequency of a second mixer 72. The mixer 72 receives a local oscillator injection frequency from a crystal oscillator 74.

The output of the mixer 72 is applied to an IF amplifier 76 connected as a balance differential amplifier with a controlled constant current source and AGC capability. At the input of the amplifier 76 there is connected a double tuned filter 78 and the output terminal is also connected to a double tuned filter 80. Additional gain is obtained by an IF amplifier 82 having the filter 80 at the input terminal and the output terminal connected to a double tuned filter 84. An active detector 86 is connected to the filter 84 which has an output connected to an AGC amplifier 88 and a noise limiter amplifier 90. Squelch action is obtained in the receiver 26 by a squelch amplifier 92 connected to the noise limiter amplifier 90. At the output of the amplifier 92 there is connected a buffer amplifier 94 having an output applied to a variable resistor 96 with a wiper arm connected to the audio section 30, see FIG. 2.

Figure 8:
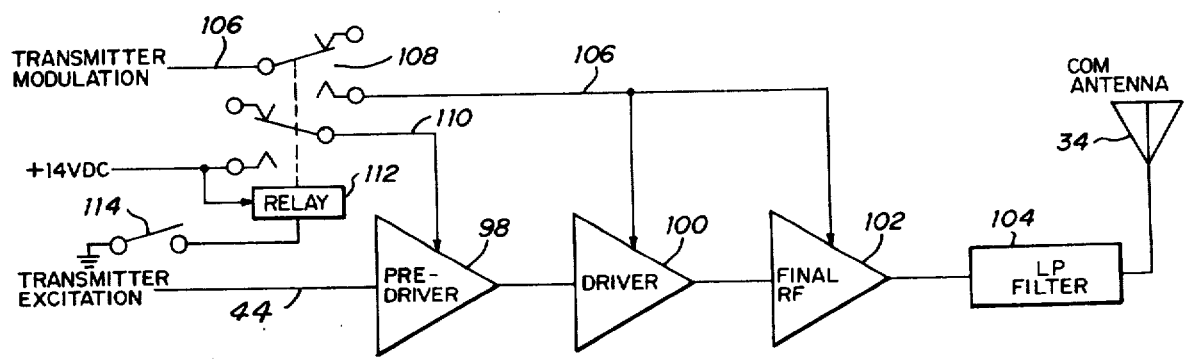
FIG. 8 is a block diagram of the transmitter section of the transceiver of FIG. 5 receiving an excitation frequency from the synthesizer of FIG. 6.

Referring to FIG. 8, there is shown a simplified block diagram of the transmitter 28 that comprises four stages of RF power gain and provides a minimum power output from 118.000 to 135.975 MHz. The transmitter excitation frequency on the line 44 is applied to the input of a predriver amplifier 98 connected class A and providing RF gain and reverse isolation. Following the predriver amplifier 98 is a transmitter driver amplifier 100 connected as a class C power amplifier providing power gain at the output stage. This amplifier is modulated for both positive and negative modulation and is a broadband circuit for the full transmitter bandwidth. Following the driver 100 there is connected a final RF amplifier 102 followed by a low pass filter 104 having an output connected to the antenna 34. The amplifier 102 is connected class C and is a tuned amplifier covering the full transmitter bandwidth with positive and negative modulation.

As is conventional with communications systems using a common antenna for both transmitting and receiving, a transmit receive switch (not shown) is interconnected between the antenna 34 and the filter 62 of the receiver and the filter 104 of the transmitter.

The driver amplifier 100 and the RF amplifier 102 are upward modulated by a modulation signal applied to a line 106 through a switch 108. The predriver amplifier 98 runs directly from a 14 volt DC supply through the switch 108 by means of a line 110. The switch 108 is controlled by means of a relay coil 112 through a panel mounted switch 114.

Figure 9:
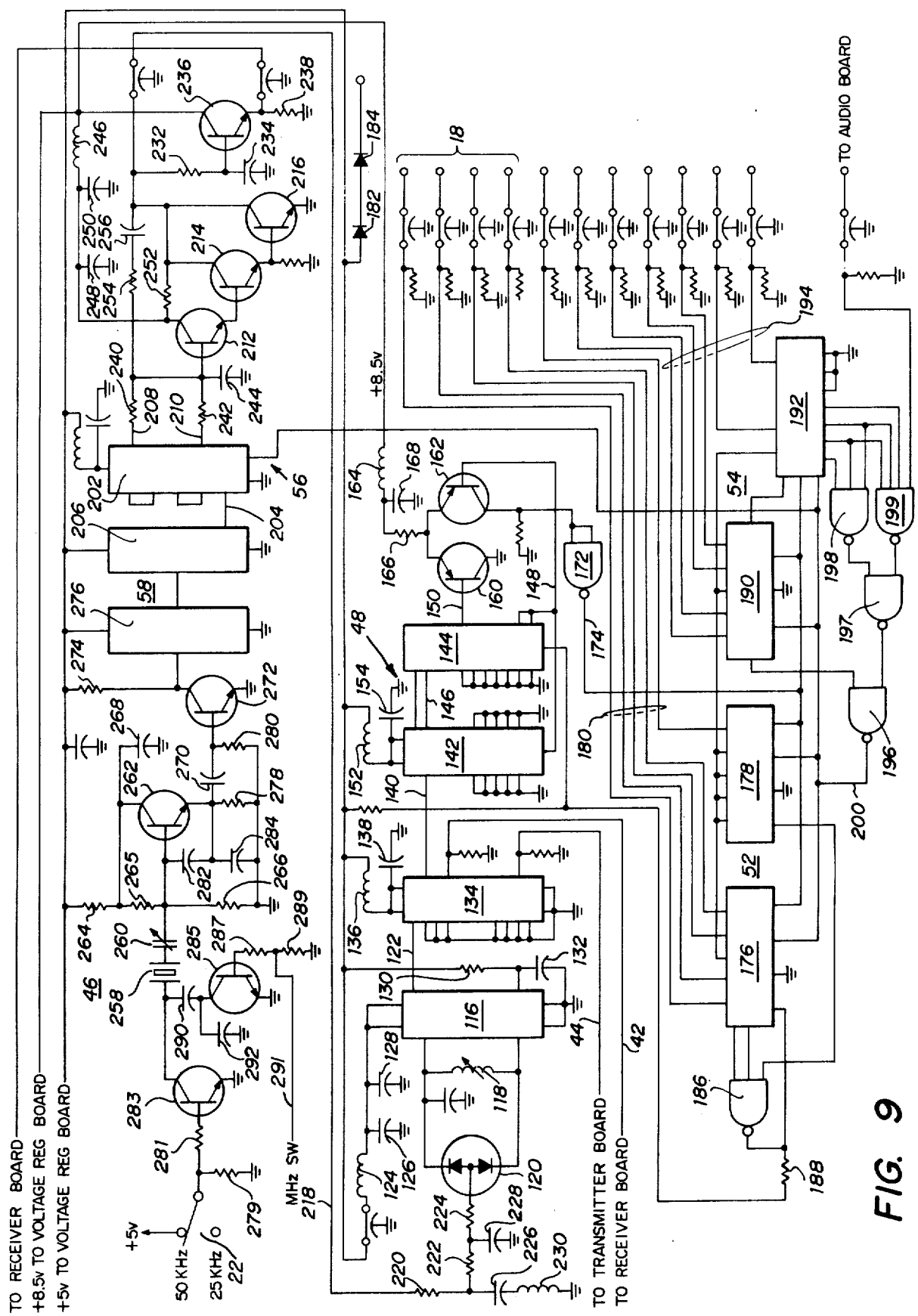
FIG. 9 is a schematic of the digital frequency synthesizer of FIG. 5.

Referring to FIG. 9, there is shown a schematic of the synthesizer logic network 11 wherein a voltage controlled oscillator 116 contains all necessary oscillator functions with the exception of tuned circuit elements including an inductor 118 and a dual varactor 120. The external components comprise the tuned circuit for the oscillator. A reverse bias on the varactor 120 establishes a high-Q capacitor which resonates with the inductor 118. The output of the oscillator 116 on a line 122 is at the final frequency, ranging from 118.000 to 135.975 MHz.

The oscillator 116 is connected to the voltage regulator 32 through an inductor 124 as a part of a filter network with capacitors 126 and 128. Also connected to the oscillator 116 in series with the voltage regulator 32 is a supply resistor 130 with a capacitor 132 providing noise suppression.

The frequency output of the oscillator 116 on the line 122 is applied to a buffer 134 comprising an integrated circuit gate element providing buffer outputs for the receiver injection and transmitter excitation frequencies, plus a drive voltage to the high speed divider 48 and the phase lock loop. A supply voltage is provided to the circuit 134 through an inductor 136 with a filter capacitor 138 connected to ground.

One output of the buffer 134 to the high speed divider 48 is applied by means of a line 140 to an input of a divider 142 having an output driving a divider 144. The dividers 142 and 144 provide a total divide factor of 20 or 21. The divider 142 is a high speed circuit capable of division factors 10 or 11, depending upon program signals on lines 146 and 148. Logic signals at a first level on both these lines enable a divide-by-11 mode and logic signals of a second level on either line 146 or 148 enable a divide-by-10 mode. The divider 144 is a high speed divide-by-2 circuit with outputs on lines 148 and 150. The line 148 is tied back to the circuit 142 such that when line 146 has a logic signal of the first level the combination of the dividers 142 and 144 divides by 10 and 11, alternately, yielding a total divide number of 21.

The divider 142 is driven by the voltage regulator 32 by means of a circuit including an inductor 152 and a capacitor 154. Similarly, the divider 144 is driven by the voltage regulator 32 through a circuit including an inductor 156 and a capacitor 158.

Since the logic swings on the lines 148 and 150 of the divider 144 are compatible only with the emitter coupled logic, it is necessary to translate these levels to high level type logic, swinging from ground to about 4 volts. This is accomplished with level translators comprising transistors 160 and 162. The transistors 160 and 162 form a difference amplifier with the collector electrode of the transistor 162 swinging from ground to 4 volts to provide a high level logic compatible signal. Transistor 162 is base coupled to the line 148. The transistors 160 and 162 are emitter coupled to a line from the voltage regulator 32 through an inductor 164 in series with a resistor 166 with a capacitor 168 coupled to ground.

The output of the translator transistor 162 is coupled to a NAND gate 172 having an output tied to a line 174 connected to the fractional MHz divider 52 and the whole MHz divider 54. The fractional MHz divider 52 comprises registers 176 and 178 programmed with a 19's complement number from the fractional MHz switches connected to the fractional MHz tuner 18. The frequency selectable switches for the fractional MHz divider 52 are connected to the registers 176 and 178 over lines 180. Power is supplied to the frequency switches through diodes 182 and 184.

As previously discussed, after one count from the fractional MHz divider 52, the high speed divider switches from the divide-by-21 mode to the divide-by-20 mode. This function is completed by the operation of a NAND gate 186 connected to the registers 176 and 178 and having an output coupled through a resistor 188 to the register 144.

Also driven from the output of the NAND gate 172 is the whole MHz divider 54 comprising registers 190 and 192 having a count corresponding to the selected whole MHz frequency. The frequency selector switch coupled to the whole MHz tuner 20 and connected to the registers 190 and 192 programs the registers into a 139's complement. NAND gates 196–199 detect the terminal count and set up a program enable signal on a line 200 for the four registers 176, 178, 190 and 192.

Since the whole MHz counter 54 operates in both receive and transmit modes, two separate gates are used to determine an end of count state. One gate is inhibited and a second gate recognizes an end of count state of 149 in the receive mode. In the transmit mode, a gate recognizing count 139 is enabled and a frequency programmed by the frequency selector switches is generated.

Also coupled to the line 200 is an integrated circuit 202 as part of the frequency/phase comparator 56. In addition to receiving clock pulses on the line 200, the circuit 202 also receives clock pulses on a line 204 from a flip-flop 206 as part of the reference divider 58.

The circuit 202 provides outputs on lines 208 and 210 corresponding to the frequency and phase difference between the inputs on lines 200 and 204, with the input on line 204 held constant as a reference and the input on line 200 a variable. Signals on the lines 208 and 210 are combined and amplified in transistors 212, 214 and 216 which operate as an active filter converting the pulse signals into a constant DC level. The collector of the transistor 216 will have a DC voltage corresponding to a varactor voltage for a particular selected frequency and is connected to the varactor 120 by means of a line 218 through resistors 220, 222 and 224. Also forming a part of the circuit to the varactor 120 are capacitors 226 and 228, with the capacitor 226 in series with an inductor 230.

Also coupled to the collector electrode of the transistor 216 through a base drive circuit including a resistor 232 and a capacitor 234 is a transistor 236 that has an output developed across a resistor 238 providing the tuned bias to the receiver 20 over a line 56.

The outputs of the circuit 202 on the lines 208 and 210 are coupled to the base electrode of the transistor 212 through resistors 240 and 242 that function as a divider network. Also in the input circuit to the transistor 212 is a capacitor 244. The transistors 212, 214 and 216 are connected to the voltage regulator 32 through an inductor 246 and capacitors 248 and 250. Also in the circuit to the collector electrode of the transistors 214 and 216 is a resistor 252. A feedback circuit from the collector electrode of the transistor 216 to the interconnection of the resistors 240 and 242 includes a resistor 254 in series with a capacitor 256.

An important feature of the present invention is the ability to pull the frequency of the crystal oscillator 46. The crystal oscillator 46 includes a crystal 258 in series with a variable capacitor 260 for driving the base electrode of a transistor 262. The base electrode of the transistor 262 is biased through a resistance network including resistors 264–266. The collector electrode of the transistor 262 is interconnected to the junction of the resistors 264 and 265 and grounded through a capacitor 268. The emitter electrode of the transistor 262 is coupled through a capacitor 270 to the base electrode of a transistor 272 having an output developed across a resistor 274 connected to a register 276 as part of the reference divider 58. Also in the emitter electrode circuit of the transistor 262 are resistors 278 and 280 along with capacitors 282 and 284.

To pull the reference frequency from the crystal 258, the toggle switch 22 is connected to a voltage divider network of resistors 279 and 281 with the latter connected to the base electrode of a transistor switch 283. The 50 KHz position of the switch 22 applies a 5 volt DC voltage to the voltage divider network. A transistor switch 285, also for pulling the frequency of the reference crystal 258, is connected to a mid-band switch as a part of the selector switch 21 through a voltage divider including resistors 287 and 289. The transistor switches 283 and 285 control the shunting of capacitors 290 and 292 with the capacitor 260. By selectively closing the transistor switches 283 and 285, the capacitance in series with the crystal 258 is varied.

To divide the output of the crystal oscillator 46 to provide a 50 KHz signal to the frequency/phase comparator 56, the output of the transistor 272 is coupled to the register 276 and provides an output through the flip-flop 206 to produce a 50 KHz signal on the line 204. The register 276 divides the reference frequency by a total of 32 to provide a reference frequency on the line 204.

As an example of the operation of the crystal oscillator 46, the reference oscillator operates at 1.600000 MHz. This frequency from the crystal 258 is divided by 32 in the register 276, yielding a reference frequency of 50 KHz. The VCO 38 then operates at any frequency that is divisible by a whole integer to yield 50 KHz, or any submultiple thereof, when the system is operating with the toggle switch 22 in the 50 KHz position to provide 50 KHz increments. For example, to generate a receiver injection frequency or transmitter excitation frequency of 118.000 MHz, the division factor of the phase lock loop is 2360, that is, 118.000 MHz divided by 2360 equals 50 KHz.

To generate 720 selectable frequencies at 25 KHz increments, the reference crystal 258 which, in this example, is operating at 1.600000 MHz is "pulled" in frequency by a ratio of 122.525 divided by 122.500 or 1.00020408 times for the lower half of the operating range. The 1.600000 MHz frequency then becomes 1.600327 MHz, or an increase of 327 Hz out of 1.600000 MHz. The crystal frequency now supplied to the register 276 is 1.600327 MHz which is divided by 32 thereby yielding a reference frequency on the line 204 of 50.01 KHz. Considering the previous example where the phase lock loop is set at a division factor of 2360, the generated receiver injection frequency or transmitter excitation frequency equals 118.025 MHz. Thus, by pulling the crystal frequency from 1.600000 MHz to 1.600327 MHz, the generated frequency changes from 118.000 MHz to 118.025 MHz.

With the toggle switch 22 in the 50 KHz position, the transistor 283 is conducting thereby shorting the capacitors 290 and 292. In this case, only the capacitor 260 is in series with the crystal 258 and the reference oscillator operates at 1.600000 MHz. When the toggle switch 22 is changed to the 25 KHz position, the transistor 283 is nonconducting and the capacitors 290, 292 and 260 are in series with the crystal 258. Now the output of the crystal oscillator is 1.600327 MHz which, as shown previously, changes the receiver or transmitter frequency by 0.025 MHz. That is, without changing the selector dials 18 or 20 the receiver or transmitter frequency changes from, for example, 118.000 MHz to 118.025 MHz thereby doubling the number of selectable frequencies for each position of the dials 18 and 20.

To cover the full range from 118.000 to 135.975 MHz, this pulled frequency is completed in two steps. The frequency is pulled 327 Hz in the range of 118.000 to 126.975 MHz, with 122.500 MHz representing the midpoint of the lower half of the frequency spectrum. The upper half of the frequency range, that is, 127.000 MHz to 135.975 MHz is pulled in frequency by the ratio of 131.250 divided by 131.500 or 1.00019011 times. For this upper half of the frequency range, the crystal frequency of 1.600000 MHz is pulled to 1.600304 MHz, an increase of 304 Hz out of 1.600000 MHz. To pull the crystal frequency by 304 Hz instead of 327 Hz, a signal from the midband switch (part of the selector switch 21) is connected to the line 291 to turn on the transistor 285 thereby shorting the capacitor 292 to ground. Now when the toggle switch 22 is placed in the 25 KHz position only the capacitor 290 will be in series with the capacitor 260 to oscillate with the crystal 258.

As an example of the operation of the circuit in the upper half of the frequency range, to generate a receiver injection frequency or transmitter excitation frequency of 127.000 MHz, the division factor of the phase lock loop is set at 2540. With the toggle switch 22 in the 50 KHz position, the crystal 258 operates at 1.600000 MHz yielding a reference frequency of 50 KHz. The phase lock loop is set at 2540 and an excitation frequency of 127.000 MHz is generated at the output of the buffer 40. Now by placing the toggle switch in the 25 KHz position, with the transistor 285 conducting, the transistor 283 is nonconducting and the capacitors 260 and 290 are in series with the crystal 258. The crystal 258 now operates at 1.600304 MHz yielding a reference frequency of 50.009 KHz. With the phase lock loop still set at 2540, the excitation frequency shifts from 127.000 MHz to 127.025 MHz, again without changing the selector dials 18 or 20.

In summary, placing the toggle switch 22 in the 50 KHz position turns on the transistor 283 thereby shorting the capacitors 290 and 292 and only the capacitor 260 is in the circuit for the crystal 258. The crystal then operates at the frequency of 1.600000 MHz over the full frequency range. By changing the switch 22 to the 25 KHz position, both the transistors 283 and 285 are nonconducting (only for the lower half of the frequency range) and both the capacitors 290 and 292 are in series with the capacitor 260 and the frequency is pulled 327 Hz. When operating in the upper half of the frequency spectrum with the switch 22 in the 25 KHz position, the transistor 285 is conducting thereby shorting the capacitor 292 and connecting the capacitor 290 in series with the capacitor 260, and the frequency of the crystal 258 is pulled 304 Hz. Typically, the capacitor 260 is set at 32 microfarads, the capacitor 290 is 15 picofarads and the capacitor 292 is 124 picofarads.

While only one embodiment of the invention, together with modifications thereof, has been described in detail herein and shown in the accompanying drawings, it will be evident that various further modifications are possible without departing from the scope of the invention.

What is claimed is:

1. In a multichannel communication system having means for selecting an operating frequency and a digital display of the selected frequency, comprising in combination:
- a frequency generator coupled to the means for selecting and providing at an output terminal the operating frequency, said generator including a reference oscillator comprising:
    - a crystal selected to oscillate at a desired base reference frequency,
    - capacitance means connected to said crystal in a circuit to oscillate therewith,
    - means for changing the capacitance of said means to pull the oscillations of said crystal from one frequency to an alternate frequency, and
    - an amplifier having an input connected to receive the oscillations of said crystal and generating a reference output frequency for said frequency generator, and
- masking means coupled to said means for changing to modify the digital display to indicate selected frequency ranges.

2. In a multichannel communication system as set forth in claim 1 wherein said means for changing includes a toggle switch mounted in juxtaposition to said digital display, and said masking means includes a slidably mounted mask coupled to move with the operation of said toggle switch to change the number of digital positions readable at said display.

3. In a multichannel communications systems as set forth in claim 2 wherein said slidably mounted mask alternately exposes one of the two least significant positions of the digital display.

4. In a multichannel communications system as set forth in claim 1 wherein said capacitance means includes a first capacitor connected in series with said crystal to oscillate at the base reference frequency, and a second capacitor also connected in series with said crystal and said first capacitor, and
- said means for changing further includes a transistor coupled to said second capacitor and having a base electrode connected to a toggle switch to shunt said capacitor to vary the effective capacitance in series with said crystal.

5. In a multichannel communications system as set forth in claim 4 wherein said capacitance means further includes a third capacitor also connected in series with said crystal and said first and second capacitors, and
- said means for changing includes a second transistor coupled to said third capacitor to shunt said capacitor to further vary the effective capacitance in series with said crystal.

* * * * *